United States Patent
Moon et al.

(10) Patent No.: US 11,764,283 B2
(45) Date of Patent: Sep. 19, 2023

(54) SEMICONDUCTOR DEVICE INCLUDING CAPACITOR

(71) Applicant: Samsung Electronics Co., Ltd., Suwon-si (KR)

(72) Inventors: Sunmin Moon, Yongin-si (KR); Young-Lim Park, Anyang-si (KR); Kyuho Cho, Hwaseong-si (KR); Hanjin Lim, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/720,198

(22) Filed: Apr. 13, 2022

(65) Prior Publication Data
US 2022/0238691 A1      Jul. 28, 2022

Related U.S. Application Data

(63) Continuation of application No. 17/390,864, filed on Jul. 30, 2021, now Pat. No. 11,621,339, which is a
(Continued)

(30) Foreign Application Priority Data

Jul. 7, 2017  (KR) .................. 10-2017-0086598

(51) Int. Cl.
*H01L 29/51*      (2006.01)
*H01L 21/762*     (2006.01)
*H01L 29/15*      (2006.01)
(Continued)

(52) U.S. Cl.
CPC ...... *H01L 29/517* (2013.01); *H01L 21/76221* (2013.01); *H01L 28/90* (2013.01);
(Continued)

(58) Field of Classification Search
None
See application file for complete search history.

(56) References Cited

U.S. PATENT DOCUMENTS 8,212,301 B2  7/2012  Park
8,722,504 B2  5/2014  Deweerd et al.
(Continued)

FOREIGN PATENT DOCUMENTS

JP    2014044993 A    3/2014
KR    100965771 B1    6/2010
(Continued)

OTHER PUBLICATIONS

English translation of KR101116166, total pp. 18 (Year: 2012).
(Continued)

*Primary Examiner* — Bo B Jang
(74) *Attorney, Agent, or Firm* — Renaissance IP Law Group LLP

(57) ABSTRACT

Disclosed is a semiconductor device including a bottom electrode, a dielectric layer, and a top electrode that are sequentially disposed on a substrate. The dielectric layer includes a hafnium oxide layer including hafnium oxide having a tetragonal crystal structure, and an oxidation seed layer including an oxidation seed material. The oxidation seed material has a lattice constant having a lattice mismatch of 6% or less with one of a horizontal lattice constant and a vertical lattice constant of the hafnium oxide having the tetragonal crystal structure.

19 Claims, 11 Drawing Sheets

Related U.S. Application Data continuation of application No. 17/035,675, filed on Sep. 28, 2020, now Pat. No. 11,114,541, which is a continuation of application No. 15/995,049, filed on May 31, 2018, now Pat. No. 10,892,345.

(51) Int. Cl.
*H01L 29/06* (2006.01)
*H10B 12/00* (2023.01)
*H01L 49/02* (2006.01)

(52) U.S. Cl.
CPC ........ *H01L 29/0649* (2013.01); *H01L 29/152* (2013.01); *H01L 29/518* (2013.01); *H10B 12/033* (2023.02)

(56) References Cited

U.S. PATENT DOCUMENTS

| | | |
|---|---|---|
| 9,437,420 B2 | 9/2016 | Cho et al. |
| 11,088,240 B2 | 8/2021 | Kim et al. |
| 11,322,578 B2 | 5/2022 | Lim et al. |
| 2009/0273882 A1 | 11/2009 | Park et al. |
| 2011/0116209 A1 | 5/2011 | Park |
| 2013/0071988 A1 | 3/2013 | Deweerd et al. |
| 2015/0357399 A1 | 12/2015 | Cho et al. |
| 2016/0133691 A1 | 5/2016 | Phatak et al. |
| 2017/0018604 A1 | 1/2017 | Ahn et al. |

FOREIGN PATENT DOCUMENTS

| | | |
|---|---|---|
| KR | 101060740 B1 | 8/2011 |
| KR | 101116166 B1 | 3/2012 |
| KR | 20120068596 A | 6/2012 |
| KR | 20180120308 A | 11/2018 |

OTHER PUBLICATIONS

Ex Parte Quayle Action for U.S. Appl. No. 17/390,864, dated Sep. 12, 2022.

Notice of Allowance for U.S. Appl. No. 17/390,864, dated Nov. 23, 2022.

SEMICONDUCTOR DEVICE INCLUDING CAPACITOR

CROSS-REFERENCE TO RELATED APPLICATION

This application is a continuation of U.S. application Ser. No. 17/390,864 filed Jul. 30, 2021, which is a continuation of U.S. application Ser. No. 17/035,675 filed Sep. 28, 2020, issued as U.S. Pat. No. 11,114,541, which is a continuation of application Ser. No. 15/995,049, filed May 31, 2018, issued as U.S. Pat. No. 10,892,345, which claims priority under 35 U.S.C § 119 to Korean Patent Application No. 10-2017-0086598 filed on Jul. 7, 2017, the disclosure of which is incorporated by reference herein in its entirety.

TECHNICAL FIELD

The present inventive concepts relate to a semiconductor device.

DISCUSSION OF RELATED ART

As semiconductor devices are becoming highly integrated, capacitors with high capacitance are required in a limited area.

SUMMARY

According to exemplary embodiments of the present inventive concepts, a semiconductor may include a bottom electrode, a dielectric layer, and a top electrode that are sequentially disposed on a substrate. The dielectric layer includes a hafnium oxide layer including hafnium oxide having a tetragonal crystal structure having a horizontal lattice constant and a vertical lattice constant, and an oxidation seed layer including an oxidation seed material. The oxidation seed material includes a lattice constant having a lattice mismatch of 6% or less with one of the horizontal lattice constant and the vertical lattice constant of the hafnium oxide.

According to exemplary embodiments of the present inventive concepts, a semiconductor includes a capacitor including a bottom electrode, a dielectric layer, and a top electrode that are sequentially disposed on a substrate. The dielectric layer includes a hafnium oxide layer including hafnium oxide having a tetragonal crystal structure and an oxidation seed layer including zirconium oxide, niobium oxide, germanium oxide, tin oxide, molybdenum oxide, or titanium oxide.

According to exemplary embodiments of the present inventive concepts, a semiconductor includes a bottom electrode, a top electrode, a dielectric layer, and a conductive seed layer, the dielectric layer and conductive seed layer being disposed between the bottom and top electrodes. The dielectric layer includes an oxidation seed layer and a hafnium oxide layer between the oxidation seed layer and the conductive seed layer. The hafnium oxide layer includes hafnium oxide having a tetragonal crystal structure having a horizontal lattice constant and a vertical lattice constant. The oxidation seed layer includes an oxidation seed material including a lattice constant having a lattice mismatch of 6% or less with one of the horizontal lattice constant and the vertical lattice constant of the hafnium oxide. The conductive seed layer includes a conductive seed material including a lattice constant having a lattice mismatch of 2% or less with one of the horizontal lattice constant and the vertical lattice constant of the hafnium oxide.

BRIEF DESCRIPTION OF THE DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
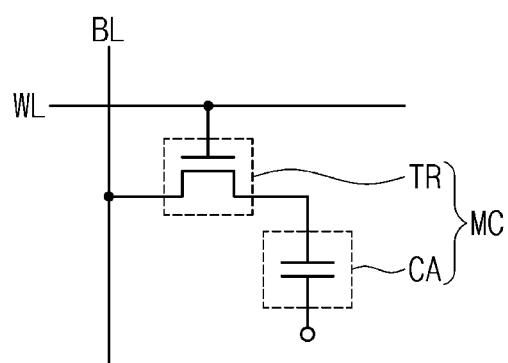
FIG. 1 illustrates a circuit diagram showing a unit memory cell of a semiconductor device according to exemplary embodiments of the present inventive concepts.

It will be described hereinafter exemplary embodiments of the present inventive concepts with reference to the accompanying drawings. Like reference numerals may indicate like components throughout the description.

FIG. 1 illustrates a circuit diagram showing a unit memory cell of a semiconductor device according to exemplary embodiments of the present inventive concepts.

Referring to FIG. 1, a memory cell MC may be connected between a word line WL and a bit line BL crossing each other. The memory cell MC may include a transistor TR connected to the word line WL and a capacitor CA connected to the transistor TR. The transistor TR may have a drain region connected to the bit line BL and a source region connected to the capacitor CA. The transistor TR may selectively control a charge flow into the capacitor CA. The memory cell MC may store data of "0" or "1" depending on the amount of charges that the capacitor CA stores.

It will be hereinafter described exemplary embodiments of a semiconductor device including the capacitor CA of FIG. 1.

Figure 2A:
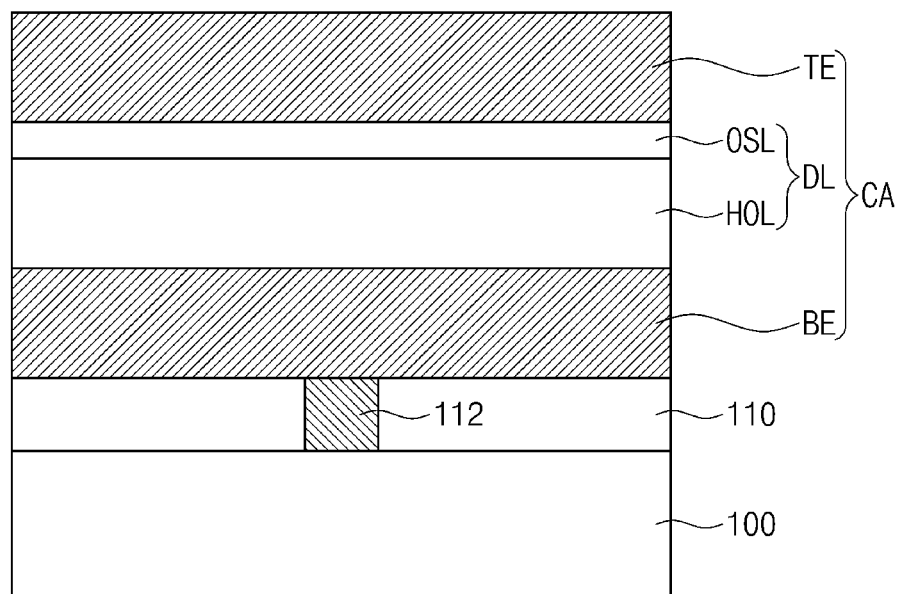
FIG. 2A illustrates a cross-sectional view showing a semiconductor device according to exemplary embodiments of the present inventive concepts.
Figure 2B:
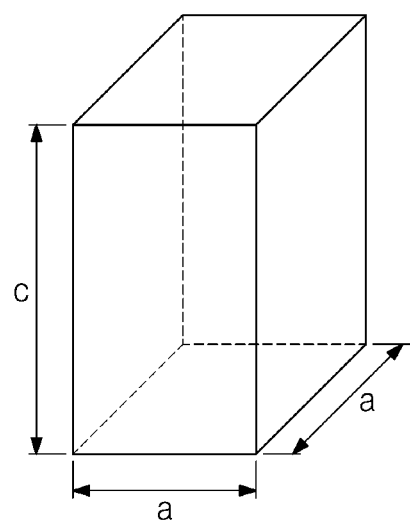
FIG. 2B illustrates a transparent perspective view showing a unit structure of a hafnium oxide layer according to exemplary embodiments of the present inventive concepts.

FIG. 2A illustrates a cross-sectional view showing a semiconductor device according to exemplary embodiments of the present inventive concepts. FIG. 2B illustrates a transparent perspective view showing a unit structure of a hafnium oxide layer according to exemplary embodiments of the present inventive concepts.

Referring to FIG. 2A, a semiconductor device may include a capacitor CA formed on a substrate 100. The capacitor CA may correspond to the capacitor CA discussed with reference to FIG. 1.

The substrate 100 may include a semiconductor substrate. For example, the substrate 100 may include a silicon substrate, a germanium substrate, or a silicon-germanium substrate.

A transistor (not shown) may be provided on the substrate 100. The substrate 100 may be provided therein with some components (e.g., source and drain regions) of the transistor. The transistor may correspond to the transistor TR discussed with reference to FIG. 1.

An interlayer dielectric layer 110 may be provided on the substrate 100. The interlayer dielectric layer 110 may cover the transistor. For example, the interlayer dielectric layer 110 may include silicon oxide, silicon nitride, or silicon oxynitride.

A contact plug 112 may be provided in the interlayer dielectric layer 110. The contact plug 112 may be electrically coupled to one terminal of the transistor. The contact plug 112 may include a conductive material. For example, the contact plug 112 may include impurity-doped semiconductor (e.g., doped silicon, doped germanium, or doped silicon-germanium), metal (e.g., titanium, tantalum, or tungsten), conductive metal nitride (e.g., titanium nitride or tantalum nitride), or metal-semiconductor compound (e.g., metal silicide).

The capacitor CA may be provided on the interlayer dielectric layer 110. The capacitor CA may include a bottom electrode BE, a dielectric layer DL, and a top electrode TE.

The bottom electrode BE may be provided on the interlayer dielectric layer 110. The bottom electrode BE may be electrically connected through the contact plug 112 to the one terminal of the transistor. The bottom electrode BE may include a conductive material. For example, the bottom electrode BE may include impurity-doped semiconductor, metal, conductive metal nitride, or metal-semiconductor compound.

The top electrode TE may be disposed on the bottom electrode BE. The top electrode TE may be spaced apart from the bottom electrode BE. The top electrode TE may include a conductive material. For example, the top electrode TE may include impurity-doped semiconductor, metal, conductive metal nitride, or metal-semiconductor compound.

The dielectric layer DL may be disposed between the top electrode TE and the bottom electrode BE. The dielectric layer DL may include a hafnium oxide layer HOL and an oxidation seed layer OSL. The oxidation seed layer OSL may be disposed between the hafnium oxide layer HOL and the top electrode TE. The hafnium oxide layer HOL and the oxidation seed layer OSL may be in contact with each other. The hafnium oxide layer HOL may have a thickness ranging from about 5 Å to about 100 Å, and the oxidation seed layer OSL may have a thickness ranging from about 5 Å to about 100 Å.

The hafnium oxide layer HOL may have a tetragonal crystal structure. For example, the hafnium oxide layer HOL may include hafnium oxide having a tetragonal crystal structure as illustrated in FIG. 2B. The tetragonal hafnium oxide may have three lattice constants, two of which are the same as each other and the remainder of which is different from the two lattice constants. For the tetragonal hafnium oxide, the two same lattice constants a may each be defined to refer to a horizontal lattice constant, and the remainder lattice constant c may be defined to refer to a vertical lattice constant. For the tetragonal hafnium oxide, the horizontal lattice constant a may be about 3.58 Å, and the vertical lattice constant c may be about 5.20 Å.

The tetragonal hafnium oxide may have a dielectric constant greater than hafnium oxide having a monoclinic crystal structure. For example, the dielectric constant of the tetragonal hafnium oxide may fall within a range of from about 40 to about 70, and the dielectric constant of the monoclinic hafnium oxide may be about 20.

The oxidation seed layer OSL may include an oxidation seed material. In some embodiments, the oxidation seed layer OSL may further include a small amount of nitrogen. In these embodiments, the presence of the small amount of nitrogen may be due to diffusion from an adjacent electrode (e.g., the top electrode TE).

The oxidation seed material may be an oxide that meets the following conditions: a first lattice constant condition and a first band gap energy condition.

<First Lattice Constant Condition>

The oxidation seed material may have a lattice constant having a lattice mismatch of about 6% or less with one of the horizontal lattice constant a and the vertical lattice constant c of the tetragonal hafnium oxide. The lattice mismatch may be calculated from Equation 1 or from Equation 2 below.

$$LM = \frac{|a - x|}{a} \qquad \text{[Equation 1]}$$

In Equation 1, LM is the lattice mismatch, a is the horizontal lattice constant of the hafnium oxide, and x is the lattice constant of the oxidation seed material.

$$LM = \frac{|c - x|}{c} \qquad \text{[Equation 2]}$$

In Equation 2, LM is the lattice mismatch, c is the vertical lattice constant of the hafnium oxide, and x is the lattice constant of the oxidation seed material.

<First Band Gap Energy Condition>

The oxidation seed material may have a band gap energy of about 3.0 eV or more.

As the oxidation seed material meets the first lattice constant, condition, the oxidation seed layer OSL may assist the hafnium oxide layer HOL to crystallize into the tetragonal crystal structure. The smaller lattice mismatch may more easily crystallize the hafnium oxide layer HOL into the tetragonal crystal structure.

As the oxidation seed material meets the first band gap energy condition, the oxidation seed layer OSL may act as the dielectric layer DL. Accordingly, the capacitor CA may be prevented from leakage current.

For example, the oxidation seed material may include zirconium oxide (ZrOx), niobium oxide (NbOx), germanium oxide (GeOx), tin oxide (SnOx), molybdenum oxide (MoOx), or titanium oxide (TiOx). Table 1 below may show characteristics of zirconium oxide, niobium oxide, germanium oxide, tin oxide, molybdenum oxide, and titanium oxide.

TABLE 1

|  | ZrOx | NbOx | GeOx | SnOx | MoOx | TiOx |
|---|---|---|---|---|---|---|
| crystal structure | tetragonal | orthorhombic | tetragonal | orthorhombic | orthorhombic | tetragonal |
| lattice constant (Å) | 3.59 | 3.65 | 4.99 | 3.61 | 3.66 | 3.78 |
| lattice mismatch (%) with tetragonal hafnium oxide | 0.3 | 1.9 | 3.8 | 0.8 | 2.2 | 5.6 |
| band gap energy (eV) | 5.2 | 3.5 | 6.1 | 3 | 3.05 | 3.2 |

Table 1 may demonstrate, with respect to the tetragonal hafnium oxide, the first lattice constant condition and the first band gap energy condition are satisfied in each of zirconium oxide, niobium oxide, germanium oxide, tin oxide, molybdenum oxide, and titanium oxide.

In this description, zirconium oxide, niobium oxide, germanium oxide, tin oxide, molybdenum oxide, and titanium oxide are disclosed as the oxidation seed material, but the present inventive concepts are not limited thereto. When a certain material meets the first lattice constant condition and the first band gap energy condition, the certain material may also be used as the oxidation seed material of the present inventive concepts.

In other embodiments, the oxidation seed material may have a lattice constant having a lattice mismatch of about 2% or less with one of the horizontal and vertical lattice constants a and c of the tetragonal hafnium oxide. In these embodiments, the oxidation seed material may include zirconium oxide, niobium oxide, or tin oxide.

In certain embodiments, the oxidation seed material may have a lattice constant having a lattice mismatch of about 0.5% or less with one of the horizontal and vertical lattice constants a and c of the tetragonal hafnium oxide. In these embodiments, the oxidation seed material may include zirconium oxide.

Conductive lines (not shown) may be provided on the capacitor CA. The conductive lines may be electrically connected to the top electrode TE. The conductive lines may include one or more of impurity-doped semiconductor, metal, conductive metal nitride, and metal-semiconductor compound.

According to some embodiments of the present inventive concepts, a semiconductor device may have the following benefits.

The hafnium oxide layer HOL may have the tetragonal crystal structure with a high dielectric constant. The capacitor CA may then have a high capacitance.

In addition, since the oxidation seed layer OSL meets the first lattice constant condition, the hafnium oxide layer HOL may be crystallized into the tetragonal crystal structure at a relatively low temperature, compared to the case where no oxidation seed layer OSL is provided. Therefore, materials included in the bottom and top electrodes BE and TE may be prevented from being diffused into the dielectric layer DL. In conclusion, the dielectric layer DL may decrease in defect density, and a semiconductor device including the capacitor CA may become more reliable.

Figure 3A:
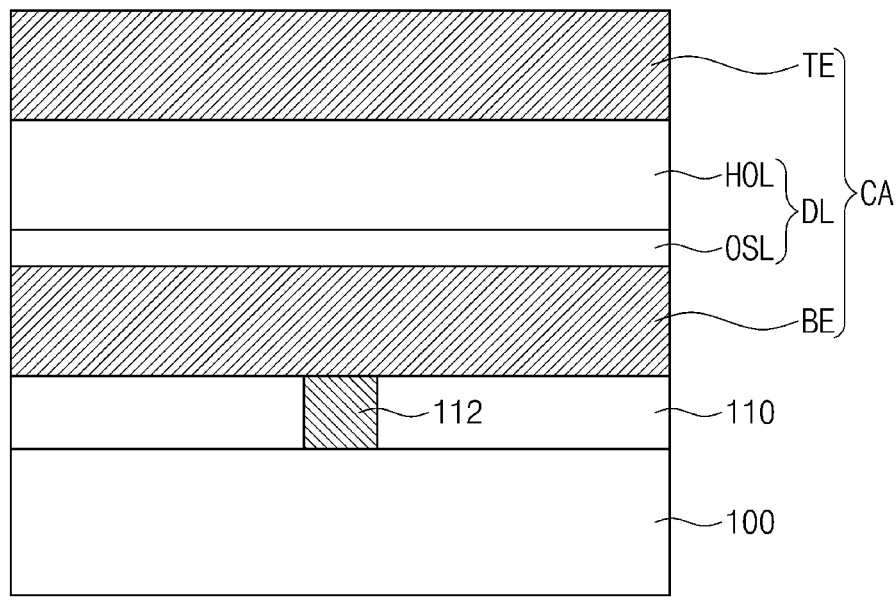
FIGS. 3A and 3B illustrate cross-sectional views showing a semiconductor device according to exemplary embodiments of the present inventive concepts.
Figure 3B:
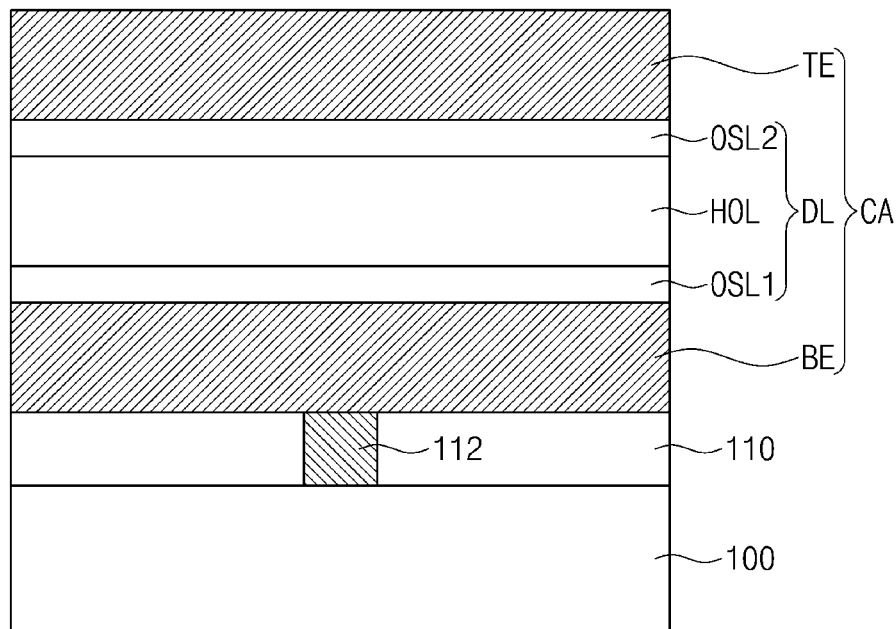

FIGS. 3A and 3B illustrate cross-sectional views showing a semiconductor device according to exemplary embodiments of the present inventive concepts. In the embodiments that follow, components substantially the same as those discussed with reference to FIGS. 2A and 2B are allocated the same reference numerals thereto, and a repetitive description thereof will be omitted.

Referring to FIG. 3A, an interlayer dielectric layer 110 may be provided on a substrate 100, and a contact plug 112 may be provided in the interlayer dielectric layer 110. The substrate 100, the interlayer dielectric layer 110, and the contact plug 112 may be substantially the same as those discussed with reference to FIG. 2A.

A capacitor CA may be provided on the interlayer dielectric layer 110. The capacitor CA may include a bottom electrode BE, a dielectric layer DL, and a top electrode TE. The bottom electrode BE and the top electrode TE may be substantially the same as those discussed with reference to FIG. 2A.

The dielectric layer DL may be disposed between the top electrode TE and the bottom electrode BE. The dielectric layer DL may include a hafnium oxide layer HOL and an oxidation seed layer OSL. The oxidation seed layer OSL may be disposed between the hafnium oxide layer HOL and the bottom electrode BE. Except for their positional relationship, the hafnium oxide layer HOL and the oxidation seed layer OSL may be respectively substantially the same as the hafnium oxide layer HOL and the oxidation seed layer OSL discussed with reference to FIGS. 2A and 2B.

A semiconductor device according to the embodiment of FIG. 3A may also have such benefits as discussed with reference to FIGS. 2A and 2B.

Referring to FIG. 3B, an interlayer dielectric layer 110 may be provided on a substrate 100, and a contact plug 112 may be provided in the interlayer dielectric layer 110. The substrate 100, the interlayer dielectric layer 110, and the contact plug 112 may be substantially the same as those discussed with reference to FIG. 2A.

A capacitor CA may be provided on the interlayer dielectric layer 110. The capacitor CA may include a bottom electrode BE, a dielectric layer DL, and a top electrode TE. The bottom electrode BE and the top electrode TE may be substantially the same as those discussed with reference to FIG. 2A.

The dielectric layer DL may be disposed between the top electrode TE and the bottom electrode BE. The dielectric layer DL may include a hafnium oxide layer HOL, a first oxidation seed layer OSL1, and a second oxidation seed layer OSL2. The first oxidation seed layer OSL1 may be disposed between the bottom electrode BE and the hafnium oxide layer HOL, and the second oxidation seed layer OSL2 may be disposed between the hafnium oxide layer HOL and the top electrode TE. The dielectric layer DL may be substantially the same as that discussed with reference to FIGS. 2A and 2B. Except for its positional relationship, the first oxidation seed layer OSL1 may be substantially the same as the oxidation seed layer OSL discussed with reference to FIGS. 2A and 2B. The second oxidation seed layer OSL2 may be substantially the same as the oxidation seed layer OSL discussed with reference to FIGS. 2A and 2B.

A semiconductor device according to the embodiment of FIG. 3B may also have such benefits as discussed with reference to FIGS. 2A and 2B.

Figure 4A:
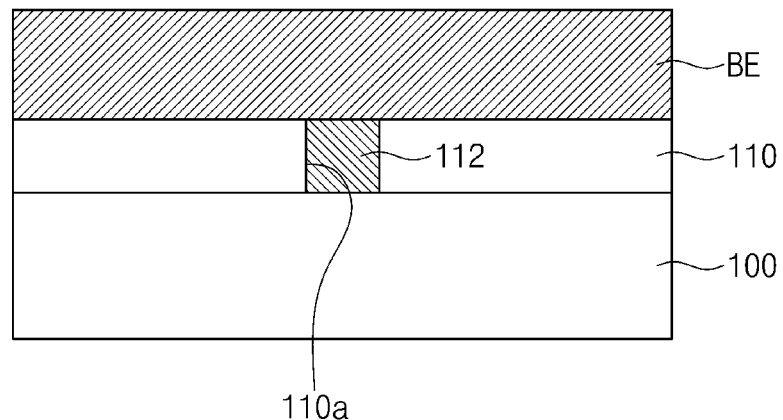
FIGS. 4A and 4B illustrate cross-sectional views showing a method of manufacturing a semiconductor device according to exemplary embodiments of the present inventive concepts.
Figure 4B:
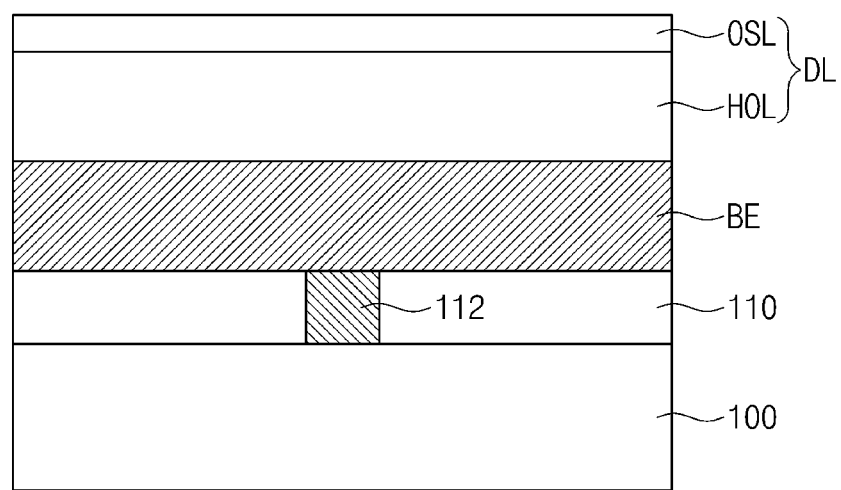

FIGS. 4A and 4B illustrate cross-sectional views showing a method of manufacturing a semiconductor device according to exemplary embodiments of the present inventive concepts. In the embodiments that follow, components substantially the same as those discussed with reference to FIGS. 2A and 2B are allocated the same reference numerals thereto, and a repetitive description thereof will be omitted.

Referring to FIG. 4A, an interlayer dielectric layer 110 may be formed on a substrate 100. The interlayer dielectric layer 110 may cover a transistor (not shown) formed on the substrate 100.

A contact plug 112 may be formed in the interlayer dielectric layer 110. The contact plug 112 may be electrically coupled to one terminal of the transistor. For example, the formation of the contact plug 112 may include forming a contact hole 110a in the interlayer dielectric layer 110, forming a conductive layer (not shown) to fill the contact hole 110a, and performing a planarization process until a top surface of the interlayer dielectric layer 110 is exposed.

A bottom electrode BE may be formed on the interlayer dielectric layer 110. The bottom electrode BE may be electrically connected to the contact plug 112. For example, the bottom electrode BE may be formed by a chemical vapor deposition (CVD) process or an atomic layer deposition (ALD) process.

Referring to FIG. 4B, a dielectric layer DL may be formed on the bottom electrode BE. The formation of the dielectric layer DL may include forming a hafnium oxide layer HOL and forming at least one oxidation seed layer OSL. Each of the hafnium oxide layer HOL and the oxidation seed layer OSL may be formed by a chemical vapor deposition process or an atomic layer deposition process.

In some embodiments, as illustrated in FIG. 4B, the hafnium oxide layer HOL and the oxidation seed layer OSL may be sequentially formed on the bottom electrode BE. In other embodiments, differently from that illustrated in FIG. 4B, the oxidation seed layer OSL and the hafnium oxide layer HOL may be sequentially formed on the bottom electrode BE (see FIG. 3A). In certain embodiments, differently from that illustrated in FIG. 4B, a first oxidation seed layer OSL1, the hafnium oxide layer HOL, and a second oxidation seed layer OSL2 may be sequentially formed on the bottom electrode BE.

The hafnium oxide layer HOL may include hafnium oxide. Immediately after its formation, the hafnium oxide layer HOL may include amorphous hafnium oxide.

The oxidation seed layer OSL may include an oxidation seed material. The oxidation seed material may be an oxide that meets the first lattice constant condition and the first band gap energy condition. For example, the oxidation seed material may include zirconium oxide, niobium oxide, germanium oxide, tin oxide, molybdenum oxide, or titanium oxide.

The oxidation seed layer OSL may have an effect on the amorphous hafnium oxide included in the hafnium oxide layer HOL. Accordingly, the hafnium oxide layer HOL may be crystallized into a tetragonal crystal structure at a relatively low temperature (e.g., ranging from about 400° C. to about 600° C.).

Referring back to FIG. 2A, a top electrode TE may be formed on the dielectric layer DL. The top electrode TE may be spaced apart from the bottom electrode BE across the dielectric layer DL. For example, the top electrode TE may be formed by a chemical vapor deposition process or an atomic layer deposition process.

The formation of the top electrode TE may be performed at a temperature ranging from about 400° C. to about 600° C. Thus, when the top electrode TE is formed, the hafnium oxide layer HOL may be at least partially crystallized. Since the hafnium oxide layer HOL is adjacent to the oxidation seed layer OSL including the oxidation seed material, a dielectric material may be crystallized into the tetragonal crystal structure.

After the top electrode TE is formed, a subsequent annealing process may be performed. The subsequent annealing process may be carried out at a temperature ranging from about 400° C. to about 600° C. The subsequent annealing process may complete crystallization of the hafnium oxide layer HOL into the tetragonal crystal structure. The subsequent annealing process may correspond to, for example, a process for forming conductive lines (not shown) on the top electrode TE.

Figure 5A:
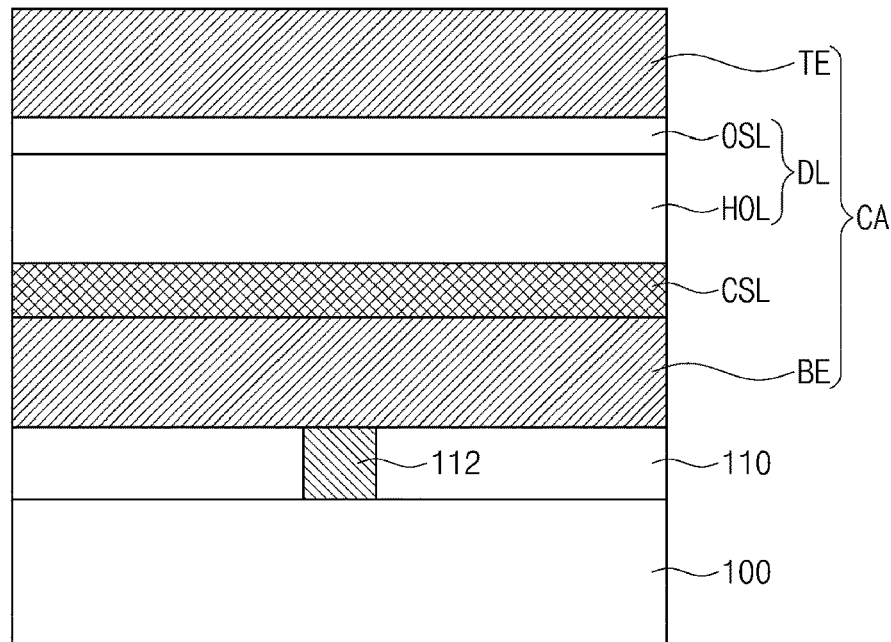
FIGS. 5A and 5B illustrate cross-sectional views showing a semiconductor device according to exemplary embodiments of the present inventive concepts.
Figure 5B:
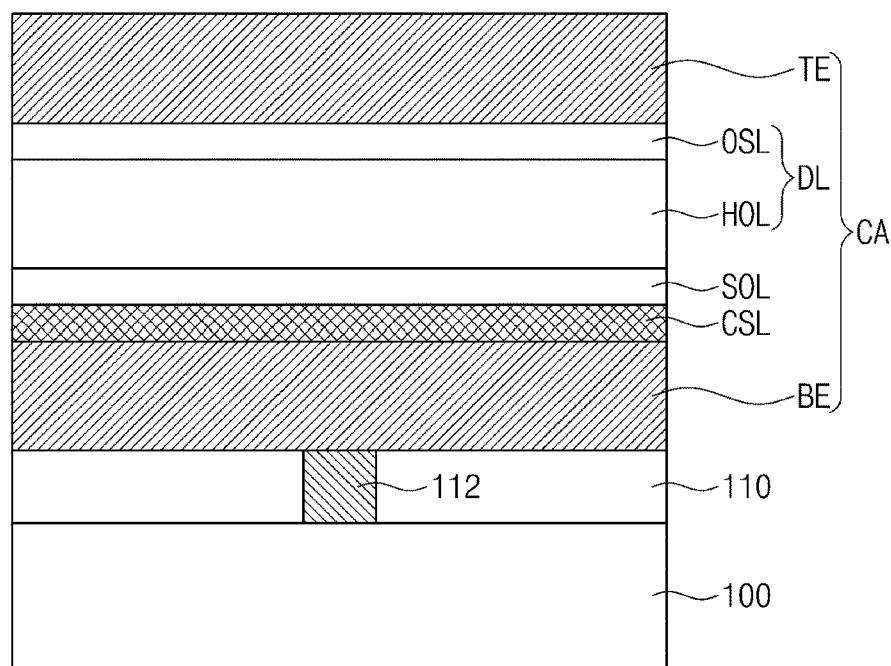

FIGS. 5A and 5B illustrate cross-sectional views showing a semiconductor device according to exemplary embodiments of the present inventive concepts. In the embodiments that follow, components substantially the same as those discussed with reference to FIGS. 2A and 2B are allocated the same reference numerals thereto, and a repetitive description thereof will be omitted.

Referring to FIGS. 2B, 5A, and 5B, an interlayer dielectric layer 110 may be provided on a substrate 100, and a contact plug 112 may be provided in the interlayer dielectric layer 110. The substrate 100, the interlayer dielectric layer 110, and the contact plug 112 may be substantially the same as those discussed with reference to FIG. 2A.

A capacitor CA may be provided on the interlayer dielectric layer 110. The capacitor CA may include a bottom electrode BE, a conductive seed layer CSL, a dielectric layer DL, and a top electrode TE.

The bottom electrode BE may be provided on the interlayer dielectric layer 110. The bottom electrode BE may be electrically connected through the contact plug 112 to the one terminal of the transistor. The bottom electrode BE may include a conductive material. For example, the bottom electrode BE may include one or more of impurity-doped semiconductor, metal, conductive metal nitride, and metal-semiconductor compound.

The top electrode TE may be disposed on the bottom electrode BE. The top electrode TE may be spaced apart from the bottom electrode BE. The top electrode TE may include a conductive material. For example, the top electrode TE may include one or more of impurity-doped semiconductor, metal, conductive metal nitride, and metal-semiconductor compound.

The conductive seed layer CSL and the dielectric layer DL may be disposed between the top electrode TE and the bottom electrode BE. The dielectric layer DL may include a hafnium oxide layer HOL and an oxidation seed layer OSL. The conductive seed layer CSL and the oxidation seed layer OSL may be spaced apart from each other across the hafnium oxide layer HOL. The conductive seed layer CSL, the hafnium oxide layer HOL, and the oxidation seed layer OSL may each have a thickness ranging from about 5 Å to about 100 Å.

The hafnium oxide layer HOL may have a tetragonal crystal structure. For example, the hafnium oxide layer HOL may include hafnium oxide having the tetragonal crystal structure as illustrated in FIG. 2B. The tetragonal hafnium oxide may have a horizontal lattice constant a of about 3.58 Å and a vertical lattice constant c of about 5.20 Å.

The conductive seed layer CSL may be disposed between the bottom electrode BE and the hafnium oxide layer HOL. The conductive seed layer CSL may include a conductive seed material. In some embodiments, the conductive seed layer CSL may further include a small amount of nitrogen. In these embodiments, the presence of the small amount of nitrogen may be due to diffusion from an adjacent electrode (e.g., the bottom electrode BE).

The conductive seed material may be a conductive material that meets the following conditions, a second lattice constant condition, a second band gap energy condition, and a work function condition.

<Second Lattice Constant Condition>

The conductive seed material may have a lattice constant having a lattice mismatch of about 2% or less with one of the horizontal lattice constant a and the vertical lattice constant c of the tetragonal hafnium oxide. The lattice mismatch may be calculated from Equation 3 or from Equation 4 below.

$$LM = \frac{|a - y|}{a} \quad \text{[Equation 3]}$$

In Equation 3, LM is the lattice mismatch, a is the horizontal lattice constant of the hafnium oxide, and y is the lattice constant of the conductive seed material.

$$LM = \frac{|c - y|}{c} \quad \text{[Equation 4]}$$

In Equation 4, LM is the lattice mismatch, c is the vertical lattice constant of the hafnium oxide, and y is the lattice constant of the conductive seed material.

<Second Band Gap Energy Condition>

The conductive seed material may have a band gap energy of about 3.5 eV or less.

<Work Function Condition>

The conductive seed material may have a work function of about 4.7 eV or more.

As the conductive seed material meets the second lattice constant condition, the conductive seed layer CSL may assist the hafnium oxide layer HOL to crystallize into the tetragonal crystal structure.

In some embodiments, as illustrated in FIG. 5B, the capacitor CA may further include a sub-oxide layer SOL between the conductive seed layer CSL and the hafnium oxide layer HOL. The sub-oxide layer SOL may have a thickness ranging from about 5 Å to about 10 Å. The sub-oxide layer SOL may be a layer originating from oxidation of a portion of the conductive seed layer CSL. As such, the sub-oxide layer SOL may include an oxide of the same metal as that included in the conductive seed layer CSL. As the conductive seed material meets the second band gap energy condition, the sub-oxide layer SOL may act as an electrode in the capacitor CA. Accordingly, the capacitor CA may be prevented from increase of an equivalent oxide thickness.

In other embodiments, as illustrated in FIG. 5A, the capacitor CA may include no sub-oxide layer SOL.

As the conductive seed material meets the work function condition, the conductive seed layer CSL may prevent the capacitor CA from leakage current.

For example, the conductive seed material may include cobalt (Co), nickel (Ni), copper (Cu), or cobalt nitride (CoNx). Table 2 below may show characteristics of cobalt, nickel, copper, and cobalt nitride.

TABLE 2

|  | Co | Ni | Cu | CoNx |
|---|---|---|---|---|
| crystal structure | cubic (FCC) | Cubic (FCC) | cubic (FCC) | cubic (FCC) |
| lattice constant (Å) | a = 3.54 | a = 3.52 | a = 3.62 | a = 3.59 |
| lattice mismatch with tetragonal hafnium oxide (%) | 1.12 | 1.68 | 1.12 | 0.28 |
| band gap energy of oxide (eV) | 1.9 | 3.4 | 2.2 | 1.9 |
| work function (eV) | 5 | 5.35 | 5.10 |  |

Table 2 may demonstrate, with respect to the tetragonal hafnium oxide, each of cobalt, nickel, copper, and cobalt nitride meets the second lattice constant condition, the second band gap energy condition, and the work function condition.

In this description, cobalt, nickel, copper, and cobalt nitride are disclosed as the conductive seed material, but the present inventive concepts are not limited thereto. When a certain material meets the second lattice constant condition, the second band gap energy condition, and the work function condition, the certain material may also be used as the conductive seed material of the present inventive concepts.

The oxidation seed layer OSL may be disposed between the hafnium oxide layer HOL and the top electrode TE. The oxidation seed layer OSL may include an oxidation seed material. In some embodiments, the oxidation seed layer OSL may further include a small amount of nitrogen. In these embodiments, the presence of the small amount of nitrogen may be due to diffusion from an adjacent electrode (e.g., the top electrode TE).

The oxidation seed material may be an oxide that meets the first lattice constant condition and the first band gap energy condition. For example, the oxidation seed material may include zirconium oxide, niobium oxide, germanium oxide, tin oxide, molybdenum oxide, or titanium oxide.

As the oxidation seed material meets the first lattice constant condition, the oxidation seed layer OSL may assist the hafnium oxide layer HOL to crystallize into the tetragonal crystal structure.

As the oxidation seed material meets the first band gap energy condition, the oxidation seed layer OSL may act as the dielectric layer DL. Accordingly, the capacitor CA may be prevented from leakage current.

Conductive lines (not shown) may be provided on the capacitor CA. The conductive lines may be electrically connected to the top electrode TE. The conductive lines may include one or more of impurity-doped semiconductor, metal, conductive metal nitride, and metal-semiconductor compound.

According to some embodiments of the present inventive concepts, a semiconductor device may have the following benefits.

The hafnium oxide layer HOL may have the tetragonal crystal structure with a high dielectric constant. The capacitor CA may then have a high capacitance.

In addition, since the oxidation seed layer OSL meets the first lattice constant condition, and since the conductive seed layer CLS meets the second lattice constant condition, the hafnium oxide layer HOL may be crystallized into the tetragonal crystal structure at a relatively low temperature, compared to the case where the oxidation seed layer OSL and/or the conductive seed layer CSL are not provided. Therefore, materials included in the bottom and top electrodes BE and TE may be prevented from being diffused into the dielectric layer DL. In conclusion, the dielectric layer DL may decrease in defect density, and a semiconductor device including the capacitor CA may become more reliable.

Figure 6A:
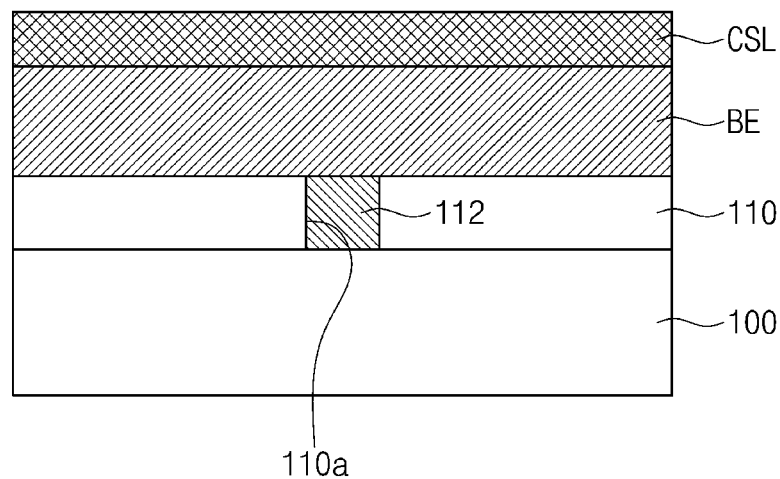
FIGS. 6A and 6B illustrate cross-sectional views showing a method of manufacturing a semiconductor device according to exemplary embodiments of the present inventive concepts.
Figure 6B:
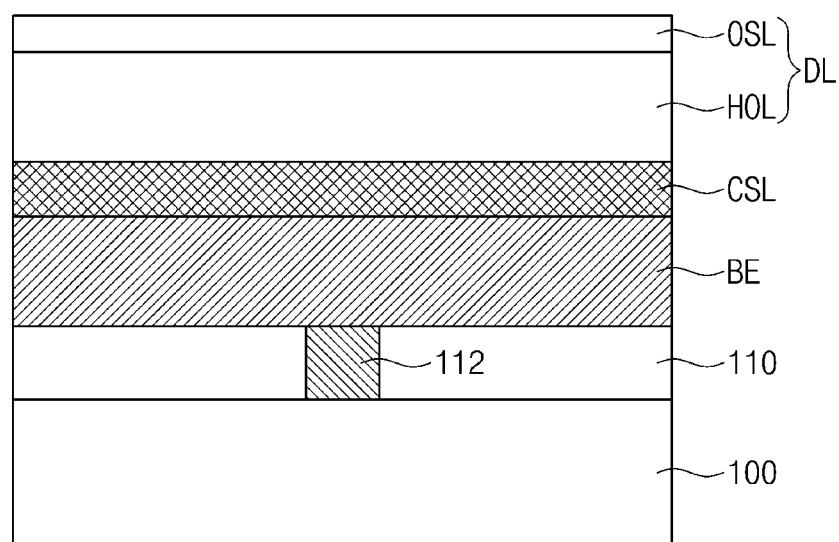

FIGS. 6A and 6B illustrate cross-sectional views showing a method of manufacturing a semiconductor device according to exemplary embodiments of the present inventive concepts. In the embodiments that follow, components substantially the same as those discussed with reference to FIGS. 5A and 5B are allocated the same reference numerals thereto, and a repetitive description thereof will be omitted.

Referring to FIG. 6A, an interlayer dielectric layer 110 may be formed on a substrate 100. The interlayer dielectric layer 110 may cover a transistor (not shown) formed on the substrate 100.

A contact plug 112 may be formed in the interlayer dielectric layer 110. The contact plug 112 may be electrically coupled to one terminal of the transistor. For example, the formation of the contact plug 112 may include forming a contact hole 110a in the interlayer dielectric layer 110, forming a conductive layer (not shown) to fill the contact hole 110a, and performing a planarization process until a top surface of the interlayer dielectric layer 110 is exposed.

A bottom electrode BE may be formed on the interlayer dielectric layer 110. The bottom electrode BE may be electrically connected to the contact plug 112. For example, the bottom electrode BE may be formed by a chemical vapor deposition process or an atomic layer deposition process.

A conductive seed layer CSL may be formed on the bottom electrode BE. For example, the conductive seed layer CSL may be formed by a chemical vapor deposition process or an atomic layer deposition process. The conductive seed layer CSL may include a conductive seed material. The conductive seed material may be a conductive material that meets the second lattice constant condition, the second band gap energy condition, and the work function condition mentioned above. For example, the conductive seed material may include cobalt, nickel, copper, or cobalt nitride.

Referring to FIG. 6B, a dielectric layer DL may be formed on the conductive seed layer CSL. The formation of the dielectric layer DL may include sequentially forming a hafnium oxide layer HOL and an oxidation seed layer OSL on the conductive seed layer CSL. Each of the hafnium oxide layer HOL and the oxidation seed layer OSL may be formed by chemical vapor deposition or atomic layer deposition.

The hafnium oxide layer HOL may include hafnium oxide. Immediately after its formation, the hafnium oxide layer HOL may include amorphous hafnium oxide.

The oxidation seed layer OSL may include an oxidation seed material. The oxidation seed material may be an oxide that meets the first lattice constant condition and the first band gap energy condition. For example, the oxidation seed material may include zirconium oxide, niobium oxide, germanium oxide, tin oxide, molybdenum oxide, or titanium oxide.

The conductive seed layer CSL and the oxidation seed layer OSL may have an effect on the amorphous hafnium oxide included in the hafnium oxide layer HOL. Accordingly, the hafnium oxide layer HOL may be crystallized into a tetragonal crystal structure at a relatively low temperature (e.g., ranging from about 400° C. to about 600° C.).

Referring back to FIGS. 5A and 5B, a top electrode TE may be formed on the dielectric layer DL. The top electrode TE may be spaced apart from the bottom electrode BE across the dielectric layer DL. For example, the top electrode TE may be formed by chemical vapor deposition or atomic layer deposition.

The formation of the top electrode TE may be performed at a temperature ranging from about 400° C. to about 600° C. Thus, when the top electrode TE is formed, the hafnium oxide layer HOL may be at least partially crystallized. Since the hafnium oxide layer HOL is adjacent to the oxidation seed layer OSL including the oxidation seed material, a dielectric material may be crystallized into the tetragonal crystal structure.

After the top electrode TE is formed, a subsequent annealing process may be performed. The subsequent annealing process may be carried out at a temperature ranging from about 400° C. to about 600° C. The subsequent annealing process may complete crystallization of the hafnium oxide layer HOL into the tetragonal crystal structure. The subsequent annealing process may correspond to, for example, a process for forming conductive lines (not shown) on the top electrode TE.

In some embodiments, as illustrated in FIG. 5B, a portion of the conductive seed layer CSL may be oxidized to form the sub-oxide layer SOL. For example, the sub-oxide layer SOL may be formed during the formation of the dielectric layer DL, during the formation of the top electrode TE, or during the subsequent annealing process. As such, the sub-oxide layer SOL may include an oxide of the same metal as that included in the conductive seed layer CSL. The sub-oxide layer SOL may have a thickness ranging from about 5 Å to about 10 Å.

In other embodiments, as illustrated in FIG. 5A, the sub-oxide layer SOL need not be formed or otherwise formed to have an invisible small thickness.

Figure 7A:
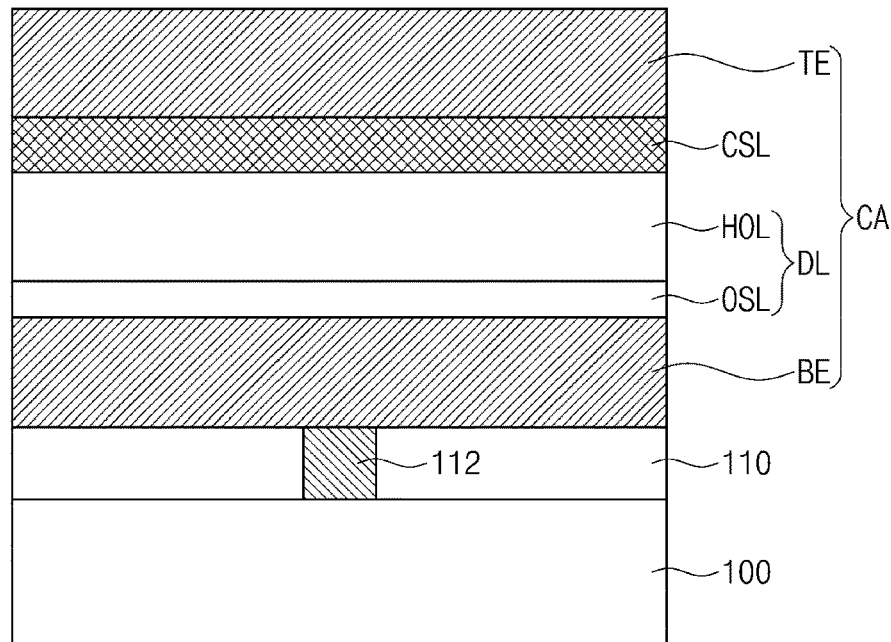
FIGS. 7A and 7B illustrate cross-sectional views showing a semiconductor device according to exemplary embodiments of the present inventive concepts.
Figure 7B:
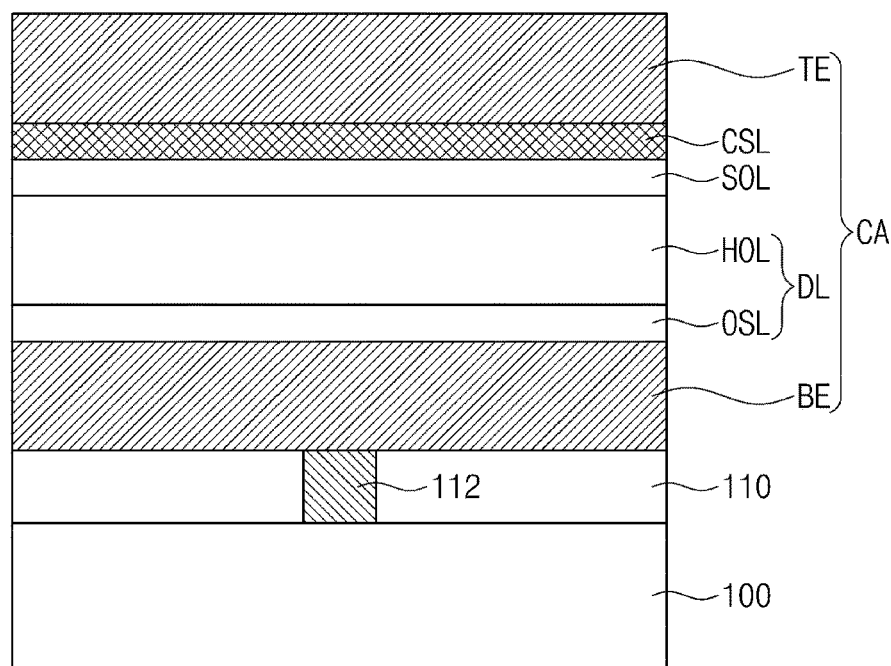

FIGS. 7A and 7B illustrate cross-sectional views showing a semiconductor device according to exemplary embodiments of the present inventive concepts. In the embodiments that follow, components substantially the same as those discussed with reference to FIGS. 5A and 5B are allocated the same reference numerals thereto, and a repetitive description thereof will be omitted.

Referring to FIGS. 2B, 7A, and 7B, an interlayer dielectric layer 110 may be provided on a substrate 100, and a contact plug 112 may be provided in the interlayer dielectric layer 110. The substrate 100, the interlayer dielectric layer 110, and the contact plug 112 may be substantially the same as those discussed with reference to FIG. 2A.

A capacitor CA may be provided on the interlayer dielectric layer 110. The capacitor CA may include a bottom electrode BE, a dielectric layer DL, a conductive seed layer CSL, and a top electrode TE.

The bottom electrode BE and the top electrode TE may be provided on the interlayer dielectric layer 110. The bottom electrode BE and the top electrode TE may be substantially the same as those discussed with reference to FIGS. 5A and 5B.

The dielectric layer DL and the conductive seed layer CSL may be disposed between the bottom electrode BE and the top electrode TE. The dielectric layer DL may include a hafnium oxide layer HOL and an oxidation seed layer OSL. The oxidation seed layer OSL may be disposed between the bottom electrode BE and the hafnium oxide layer HOL, and the conductive seed layer CSL may be disposed between the hafnium oxide layer HOL and the top electrode TE. Except for their positional relationship, the hafnium oxide layer HOL, the oxidation seed layer OSL, and the conductive seed layer CSL may be respectively substantially the same as the hafnium oxide layer HOL, the oxidation seed layer OSL, and the conductive seed layer CSL discussed with reference to FIGS. 5A and 5B.

In some embodiments, as illustrated in FIG. 7B, the capacitor CA may further include a sub-oxide layer SOL between the conductive seed layer CSL and the hafnium oxide layer HOL. The sub-oxide layer SOL may have a thickness ranging from about 5 Å to about 10 Å. The sub-oxide layer SOL may be a layer originating from oxidation of a portion of the conductive seed layer CSL. As such, the sub-oxide layer SOL may include an oxide of the same metal as that included in the conductive seed layer CSL. In other embodiments, as illustrated in FIG. 7A, the capacitor CA may include no sub-oxide layer SOL.

A semiconductor device according to the embodiments of FIGS. 7A and 7B may also have such benefits as discussed with reference to FIGS. 5A and 5B.

Figure 8A:
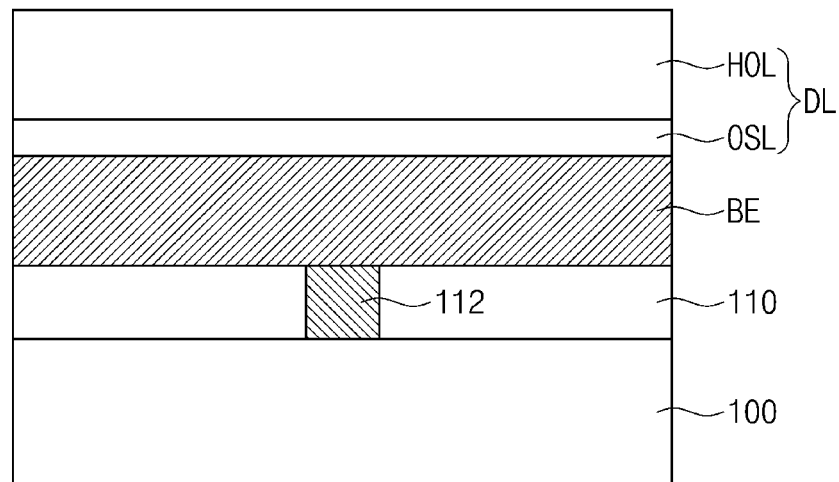
FIGS. 8A and 8B illustrate cross-sectional views showing a method of manufacturing a semiconductor device according to exemplary embodiments of the present inventive concepts.
Figure 8B:
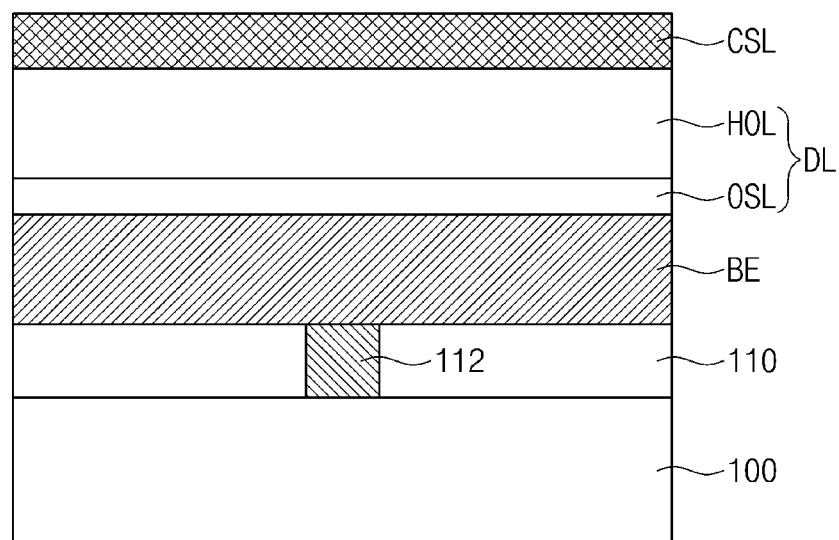

FIGS. 8A and 8B illustrate cross-sectional views showing a method of manufacturing a semiconductor device according to exemplary embodiments of the present inventive concepts. In the embodiments that follow, components substantially the same as those discussed with reference to FIGS. 7A and 7B are allocated the same reference numerals thereto, and a repetitive description thereof will be omitted.

Referring to FIG. 8A, an interlayer dielectric layer 110, a contact plug 112, and a bottom electrode BE may be sequentially formed on a substrate 100. The formations of the interlayer dielectric layer 110, the contact plug 112, and the bottom electrode BE may be substantially the same as those discussed with reference to FIG. 6A.

A dielectric layer DL may be formed on the bottom electrode BE. The formation of the dielectric layer DL may include sequentially forming an oxidation seed layer OSL and a hafnium oxide layer HOL on the bottom electrode BE. Each of the oxidation seed layer OSL and the hafnium oxide layer HOL may be formed by a chemical vapor deposition process or an atomic layer deposition process.

The oxidation seed layer OSL may include an oxidation seed material. The oxidation seed material may be an oxide that meets the first lattice constant condition and the first band gap energy condition. For example, the oxidation seed material may include zirconium oxide, niobium oxide, germanium oxide, tin oxide, molybdenum oxide, or titanium oxide.

The hafnium oxide layer HOL may include hafnium oxide. Immediately after its formation, the hafnium oxide layer HOL may include amorphous hafnium oxide.

Referring to FIG. 8B, a conductive seed layer CSL may be formed on the dielectric layer DL. For example, the conductive seed layer CSL may be formed by chemical vapor deposition or atomic layer deposition. The conductive seed layer CSL may include a conductive seed material. The conductive seed material may be a conductive material that meets the second lattice constant condition, the second band gap energy condition, and the work function condition. For example, the conductive seed material may include cobalt, nickel, copper, or cobalt nitride.

The conductive seed layer CSL and the oxidation seed layer OSL may have an effect on the amorphous hafnium oxide included in the hafnium oxide layer HOL. Accordingly, the hafnium oxide layer HOL may be crystallized into a tetragonal crystal structure at a relatively low temperature (e.g., ranging from about 400° C. to about 600° C.).

Referring back to FIGS. 7A and 7B, a top electrode TE may be formed on the conductive seed layer CSL. For example, the top electrode TE may be formed by chemical vapor deposition or atomic layer deposition.

The formation of the top electrode TE may be performed at a temperature ranging from about 400° C. to about 600° C. Thus, when the top electrode TE is formed, the hafnium oxide layer HOL may be at least partially crystallized. Since the hafnium oxide layer HOL is adjacent to the oxidation seed layer OSL including the oxidation seed material, a dielectric material may be crystallized into the tetragonal crystal structure.

After the top electrode TE is formed, a subsequent annealing process may be performed. The subsequent annealing process may be carried out at a temperature ranging from about 400° C. to about 600° C. The subsequent annealing process may complete crystallization of the hafnium oxide layer HOL into the tetragonal crystal structure. The subsequent annealing process may correspond to, for example, a process for forming conductive lines (not shown) on the top electrode TE.

In some embodiments, as illustrated in FIG. 7B, a portion of the conductive seed layer CSL may be oxidized to form a sub-oxide layer SOL. For example, the sub-oxide layer SOL may be formed during the formation of the top electrode TE and/or during the subsequent annealing process. As such, the sub-oxide layer SOL may include an oxide of the same metal as that included in the conductive seed layer CSL. The sub-oxide layer SOL may have a thickness ranging from about 5 Å to about 10 Å.

In other embodiments, as illustrated in FIG. 7A, the sub-oxide layer SOL need not be formed or otherwise formed to have an invisible small thickness.

Figure 9A:
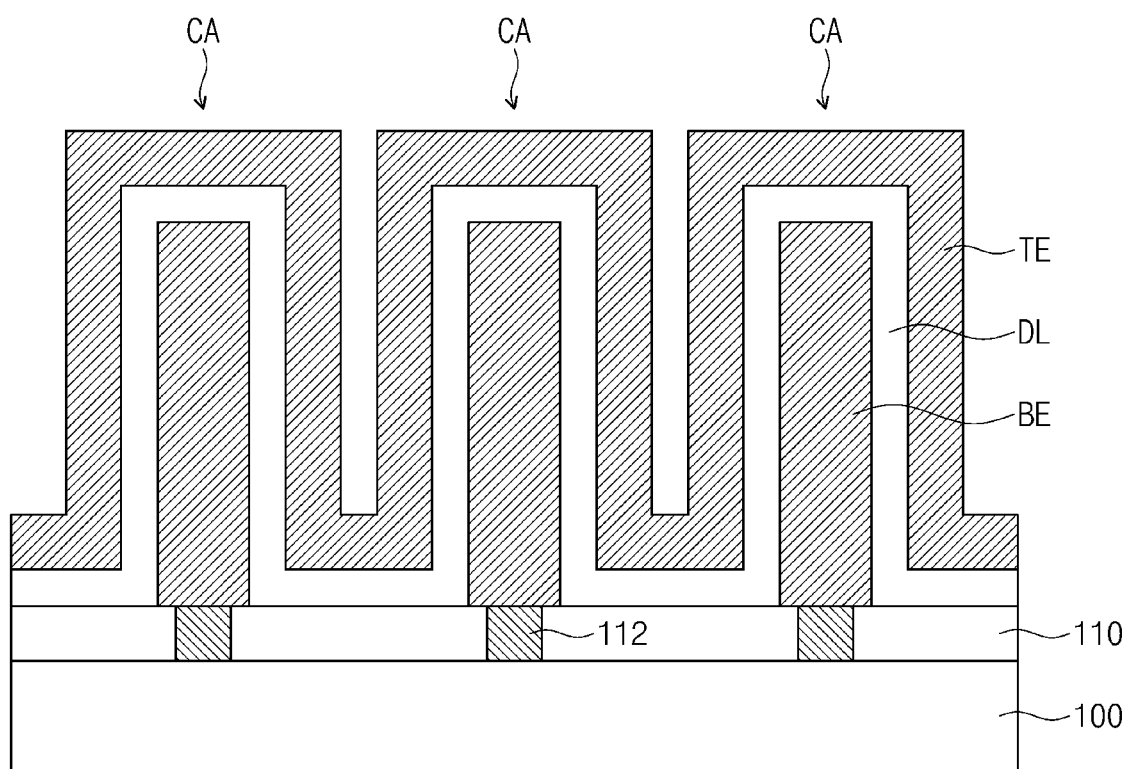
FIGS. 9A to 9C illustrate cross-sectional views showing a capacitor shape of a semiconductor device according to exemplary embodiments of the present inventive concepts.
Figure 9B:
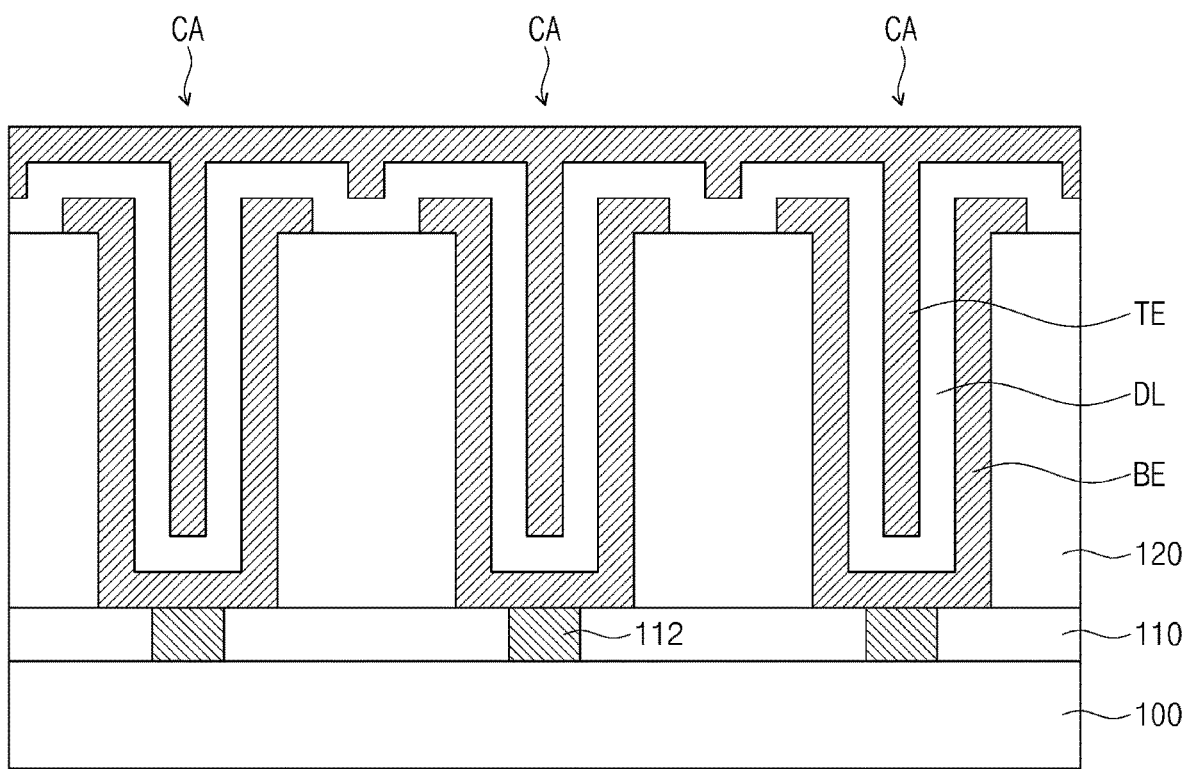
Figure 9C:
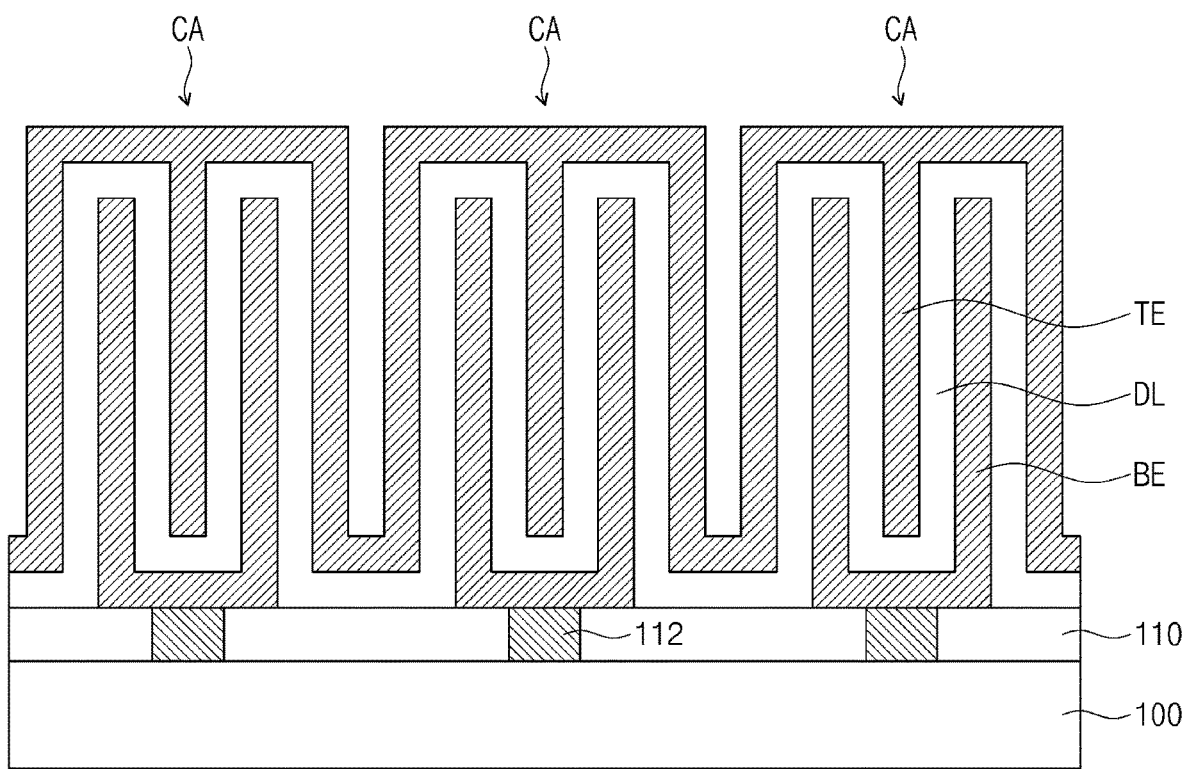

FIGS. 9A to 9C illustrate cross-sectional views showing a capacitor shape of a semiconductor device according to exemplary embodiments of the present inventive concepts.

Referring to FIGS. 9A to 9C, an interlayer dielectric layer 110 may be provided on a substrate 100. The interlayer dielectric layer 110 may cover transistors (not shown) provided on the substrate 100. Contact plugs 112 may be provided in the interlayer dielectric layer 110. The contact plugs 112 may be electrically coupled to the transistors.

Capacitors CA may be provided on the interlayer dielectric layer 110. The capacitors CA may be electrically connected to the contact plugs 112. Except for its shape, each of the capacitors CA may be substantially the same as that discussed with reference FIGS. 2A, 3A, 3B, 5A, 5B, 7A, and/or 7B.

Each of the capacitors CA may include a bottom electrode BE, a dielectric layer DL, and a top electrode TE. In some embodiments, each of the capacitors CA may further include a conductive seed layer (not shown) and a sub-oxide layer (not shown). The bottom electrode BE may be provided to each of the capacitors CA, and the dielectric layer DL and the top electrode TE may be shared by the capacitors CA.

The capacitors CA may have various shapes.

For example, as illustrated in FIG. 9A, each of the bottom electrodes BE may have a pillar shape. The dielectric layer DL may conformally cover sidewalls of the bottom electrodes BE and a top surface of the interlayer dielectric layer 110. The top electrode TE may cover the dielectric layer DL.

Alternatively, as illustrated in FIG. 9B, each of the bottom electrodes BE may be provided in an upper insulation layer 120 formed on the interlayer dielectric layer 110. Each of the bottom electrodes BE may have a hollow cylindrical shape having a closed bottom end, and sidewalls of the bottom electrodes BE may be in contact with the upper insulation layer 120. The dielectric layer DL may conformally cover inner walls of the bottom electrodes BE and a top surface of the upper insulation layer 120. The top electrode TE may cover the dielectric layer DL.

Dissimilarly, as illustrated in FIG. 9C, each of the bottom electrodes BE may have a hollow cylindrical shape having a closed bottom end. The dielectric layer DL may conformally cover inner walls and sidewalls of the bottom electrodes BE and a top surface of the interlayer dielectric layer 110. The top electrode TE may cover the dielectric layer DL.

According to exemplary embodiments of the present inventive concepts, the hafnium oxide layer may have the tetragonal crystal structure with a high dielectric constant. The capacitor may then have a high capacitance.

Further, the hafnium oxide layer may be crystallized into the tetragonal crystal structure at a relatively low temperature. Therefore, materials included in the bottom and top electrodes may be prevented from being diffused into the dielectric layer. In conclusion, the dielectric layer may decrease in defect density, and a semiconductor device including the capacitor may increase in reliability.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:
1. A semiconductor device, comprising:
a substrate;
an interlayer dielectric layer on the substrate;
a plurality of contact plugs in the interlayer dielectric layer;
a plurality of bottom electrodes laterally spaced apart from each other, each of the plurality of bottom electrodes having a pillar shape, the plurality of bottom electrodes electrically connected to the plurality of contact plugs, respectively;
a top electrode on sidewalls and top surfaces of the plurality of bottom electrodes and on a top surface of the interlayer dielectric layer; and
a dielectric layer between the plurality of bottom electrodes and the top electrode and between the interlayer dielectric layer and the top electrode,
wherein the dielectric layer includes:
a hafnium oxide layer;
a first oxidation seed layer between the plurality of bottom electrodes and the hafnium oxide layer, wherein the first oxidation seed layer includes a first seed material and nitrogen; and
a second oxidation seed layer between the top electrode and the hafnium oxide layer.

2. The semiconductor device of claim 1, wherein the first seed material includes at least one selected from the group consisting of zirconium oxide, niobium oxide, germanium oxide, tin oxide, molybdenum oxide, and titanium oxide.

3. The semiconductor device of claim 1, wherein the second oxidation seed layer includes a second seed material and nitrogen.

4. The semiconductor device of claim 3, wherein the second seed material includes at least one selected from the group consisting of zirconium oxide, niobium oxide, germanium oxide, tin oxide, molybdenum oxide, and titanium oxide.

5. The semiconductor device of claim 1, wherein:
the first oxidation seed layer has a thickness ranging from 5 Å to 100 Å, and
the second oxidation seed layer has a thickness ranging from 5 Å to 100 Å.

6. The semiconductor device of claim 5, wherein the hafnium oxide layer has a thickness ranging from 5 Å to 100 Å.

7. The semiconductor device of claim 6, wherein the hafnium oxide layer and the second oxidation seed layer are in contact with each other.

8. The semiconductor device of claim 1, wherein the hafnium oxide layer and the first oxidation seed layer are in contact with each other.

9. A semiconductor device, comprising:
a substrate;
an interlayer dielectric layer on the substrate;
a plurality of contact plugs in the interlayer dielectric layer;
a plurality of first electrodes laterally spaced apart from each other, each of the plurality of first electrodes having a pillar shape, the plurality of first electrodes disposed on the plurality of contact plugs, respectively;
a second electrode on sidewalls and top surfaces of the plurality of first electrodes and on a top surface of the interlayer dielectric layer; and
a dielectric layer between the plurality of first electrodes and the second electrode,
wherein the dielectric layer includes:
a hafnium oxide layer;
a first oxidation seed layer between the plurality of first electrodes and the hafnium oxide layer; and
a second oxidation seed layer between the second electrode and the hafnium oxide layer,
wherein the first oxidation seed layer includes a first seed material and nitrogen, and
wherein the second oxidation seed layer includes a second seed material and nitrogen.

10. The semiconductor device of claim 9, wherein the first oxidation seed layer is in contact with the plurality of first electrodes.

11. The semiconductor device of claim 9, wherein the second oxidation seed layer is in contact with the second electrode.

12. The semiconductor device of claim 9,
wherein the hafnium oxide layer and the first oxidation seed layer are in contact with each other, and
wherein the hafnium oxide layer and the second oxidation seed layer are in contact with each other.

13. The semiconductor device of claim 9, wherein the dielectric layer extends between the interlayer dielectric layer and the second electrode.

14. The semiconductor device of claim 9, wherein the first oxidation seed layer includes a lattice constant having a lattice mismatch of 6% or less with one of a horizontal lattice constant and a vertical lattice constant of the hafnium oxide layer, and
wherein the second oxidation seed layer a lattice constant having includes a lattice mismatch of 6% or less with one of the horizontal lattice constant and the vertical lattice constant of the hafnium oxide layer.

15. A semiconductor device, comprising:
a substrate;
an interlayer dielectric layer on the substrate;
a plurality of contact plugs in the interlayer dielectric layer;
a plurality of bottom electrodes laterally spaced apart from each other, each of the plurality of bottom electrodes having a pillar shape, the plurality of bottom electrodes disposed on the plurality of contact plugs and electrically connected to the plurality of contact plugs, respectively;
a top electrode on sidewalls and top surfaces of the plurality of bottom electrodes and on a top surface of the interlayer dielectric layer; and a dielectric layer between the plurality of bottom electrodes and the top electrode and between the interlayer dielectric layer and the top electrode,
wherein the dielectric layer includes:
a hafnium oxide layer;
a first oxidation seed layer between the plurality of bottom electrodes and the hafnium oxide layer; and
a second oxidation seed layer between the top electrode and the hafnium oxide layer, wherein the second oxidation seed layer includes a second seed material and nitrogen,
the first oxidation seed layer has a thickness ranging from 5 Å to 100 Å, and
the second oxidation seed layer has a thickness ranging from 5 Å to 100 Å.

16. The semiconductor device of claim 15, wherein the first oxidation seed layer includes a first seed material and nitrogen, and wherein the first oxidation seed layer is in contact with the plurality of bottom electrodes.

17. The semiconductor device of claim 16, wherein the second oxidation seed layer is in contact with the top electrode.

18. The semiconductor device of claim 16, wherein the first seed material includes at least one of zirconium oxide, niobium oxide, germanium oxide, tin oxide, molybdenum oxide, and titanium oxide, and
wherein the second seed material includes at least one selected from the group consisting of zirconium oxide, niobium oxide, germanium oxide, tin oxide, molybdenum oxide, and titanium oxide.

19. The semiconductor device of claim 15, wherein the first oxidation seed layer includes an oxidation seed material having a band gap energy of 3.0 eV or more.

* * * * *